(12) United States Patent
Nagahara et al.

(10) Patent No.: US 10,396,262 B2
(45) Date of Patent: Aug. 27, 2019

(54) LIGHT EMITTING DEVICE AND SUBSTRATE

(71) Applicant: NICHIA CORPORATION, Anan-shi, Tokushima (JP)

(72) Inventors: Seiji Nagahara, Yokohama (JP); Kazuma Kozuru, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 79 days.

(21) Appl. No.: 15/826,455

(22) Filed: Nov. 29, 2017

(65) Prior Publication Data
US 2018/0151788 A1 May 31, 2018

(30) Foreign Application Priority Data

Nov. 30, 2016 (JP) ................................. 2016-233553
Nov. 15, 2017 (JP) ................................. 2017-219732

(51) Int. Cl.
| | |
|---|---|
| *H01L 33/62* | (2010.01) |
| *H05K 1/18* | (2006.01) |
| *F21V 23/00* | (2015.01) |
| *H01L 27/15* | (2006.01) |
| *H05K 1/02* | (2006.01) |

(Continued)

(52) U.S. Cl.
CPC .............. *H01L 33/62* (2013.01); *F21K 9/238* (2016.08); *F21V 19/0025* (2013.01); *F21V 23/004* (2013.01); *H01L 25/0655* (2013.01); *H01L 25/0753* (2013.01); *H01L 27/153* (2013.01); *H01L 27/156* (2013.01); *H01L 33/32* (2013.01); *H01L 33/40* (2013.01); *H05K 1/0296* (2013.01); *H05K 1/181* (2013.01); *H05K 3/222* (2013.01); *F21Y 2113/13* (2016.08); *F21Y 2115/10* (2016.08); *H05K 1/11* (2013.01); *H05K 2201/10106* (2013.01); *H05K 2201/10287* (2013.01); *Y02P 70/611* (2015.11)

(58) Field of Classification Search
CPC ................. H01L 25/0655; H01L 33/62; H01L 23/49838; H01L 23/49844; H01L 27/153; H01L 27/156; H05K 1/11; H05K 1/181; H05K 3/222; F21V 9/001; F21V 23/004; F21K 9/238
See application file for complete search history.

(56) References Cited

U.S. PATENT DOCUMENTS

2010/0213474 A1* 8/2010 Hsu ..................... H01L 33/62
                                                                257/89
2013/0243019 A1    9/2013 Wakabayashi et al.

FOREIGN PATENT DOCUMENTS

JP          2013-191787 A       9/2013

* cited by examiner

*Primary Examiner* — Thanhha S Pham
(74) *Attorney, Agent, or Firm* — Foley & Lardner LLP

(57) ABSTRACT

A substrate for a light emitting device includes: a plurality of wiring patterns, each including: a first conductive pattern including: a light emitting element mounting region defined by a first, second, third, and fourth sides in a plan view, and a contact region; and a second conductive pattern surrounding a portion of the first side where the contact region is not present, an entirety of the second side, and a portion of or an entirety of the third side, wherein a first end portion of the second conductive pattern at the third side is positioned nearer to the fourth side than a second end portion of the second conductive pattern at the first side is to the fourth side. The third side of a second wiring pattern faces the first side of a first wiring pattern.

20 Claims, 11 Drawing Sheets

(51) Int. Cl.
  *F21V 19/00*     (2006.01)
  *H01L 33/32*     (2010.01)
  *H01L 33/40*     (2010.01)
  *H01L 25/075*    (2006.01)
  *H01L 25/065*    (2006.01)
  *F21K 9/238*     (2016.01)
  *H05K 3/22*      (2006.01)
  *F21Y 113/13*    (2016.01)
  *F21Y 115/10*    (2016.01)
  *H05K 1/11*      (2006.01)

LIGHT EMITTING DEVICE AND SUBSTRATE

CROSS-REFERENCE TO RELATED APPLICATIONS

The present application claims priority to Japanese Patent Application No. 2016-233553, filed on Nov. 30, 2016, and Japanese Patent Application No. 2017-219732, filed on Nov. 15, 2017, the disclosures of which are hereby incorporated by reference in their entireties.

BACKGROUND

1. Technical Field

The present disclosure relates to a light emitting device using a light emitting element, and a substrate on which a light emitting element can be mounted.

2. Description of Related Art

Among light emitting devices using a light emitting element, it is known to provide a light emitting device that includes an array of a plurality of light emitting elements configured to emit light of different colors and arranged in a line (see, for example, see JP 2013-191787 A). In the array described in JP 2013-191787 A, in the case where the light emitting elements respectively configured to emit light of different colors are disposed adjacent to each other to individually emit light, the light emitting elements respectively configured to emit light of different colors need to be arranged in electrically separate systems.

Accordingly, for example, a plurality of electrode plates need to be arranged at a position spaced apart from the array of the light emitting elements. Thus, the area required for wiring patterns may be increased, which may lead to difficulty in reducing the size of the light emitting device. Further, wires connecting the light emitting elements and the electrode plates may interfere with each other.

SUMMARY

Embodiments described herein have been made in view of the above-described disadvantages, and one object of certain embodiments is to provide a compact light emitting device and a substrate in each of which compact wiring patterns can properly wire adjacent light emitting elements configured to emit light of different colors while avoiding interference between wires.

A light emitting device according to one embodiment includes: a plurality of light emitting elements each including an upper electrode and a lower electrode; and the substrate on which the plurality of light emitting elements is disposed. The substrate includes a plurality of wiring patterns respectively corresponding to respective one of the plurality of light emitting elements on an upper surface of the substrate. Each of the plurality of wiring patterns includes: a first conductive pattern, including a light emitting element mounting region to which a lower electrode of the light emitting element is connected and defined by a first side, a second side, a third side, and a fourth side in sequence in a plan view, and a contact region connected to a portion of the first side of the light emitting element mounting region; and a second conductive pattern surrounding a portion of the first side where the contact region is not present, an entirety of second side, and a portion of or an entirety of third side. One end portion of the second conductive pattern at a side of the third side is positioned nearer to the fourth side than another end portion of the second conductive pattern at a side of the first side is to the fourth side. The first side of one of the wiring patterns and the third side of another one of the wiring patterns are disposed to face each other. The plurality of wiring patterns includes a first wiring pattern corresponding to one of the light emitting elements, and a second wiring pattern corresponding to another one of the light emitting elements is configured to emit light having a color different from a color of light emitted by said one of the light emitting elements. The second wiring pattern is adjacent to the first wiring pattern at a side of the first side of the first wiring pattern. The contact region of the first wiring pattern and the second conductive pattern of the second wiring pattern are connected to each other via at least one wire. The second conductive pattern of the first wiring pattern and the upper electrode of the light emitting element disposed on the second wiring pattern are connected to each other via another at least one wire.

A substrate according to another embodiment includes the plurality of wiring patterns. Each of the plurality of wiring patterns includes: a first conductive pattern, including a light emitting element mounting region defined by a first side, a second side, a third side, and a fourth side in sequence in a plan view, and a contact region connected to a portion of the first side of the light emitting element mounting region; and a second conductive pattern surrounding a portion of the first side where the contact region is not present, an entirety of the second side, and a portion of or an entirety of the third side. One end portion of the second conductive pattern at a side of the third side being positioned nearer to the fourth side than another end portion of the second conductive pattern at a side of the first side is to the fourth side. In adjacent two of the wiring patterns, the first side of one of the wiring patterns and the third side of another one of the wiring patterns are disposed to face each other.

According to certain embodiments, a compact light emitting device and a substrate can be provided, each having compact wiring patterns with which adjacent light emitting elements configured to emit light of different colors can be properly wired while avoiding interference between wires.

DETAILED DESCRIPTION

In the following, with reference to the drawings, a description will be given of certain embodiments of the present invention.

Light Emitting Device According to First Embodiment

Figure 1A:
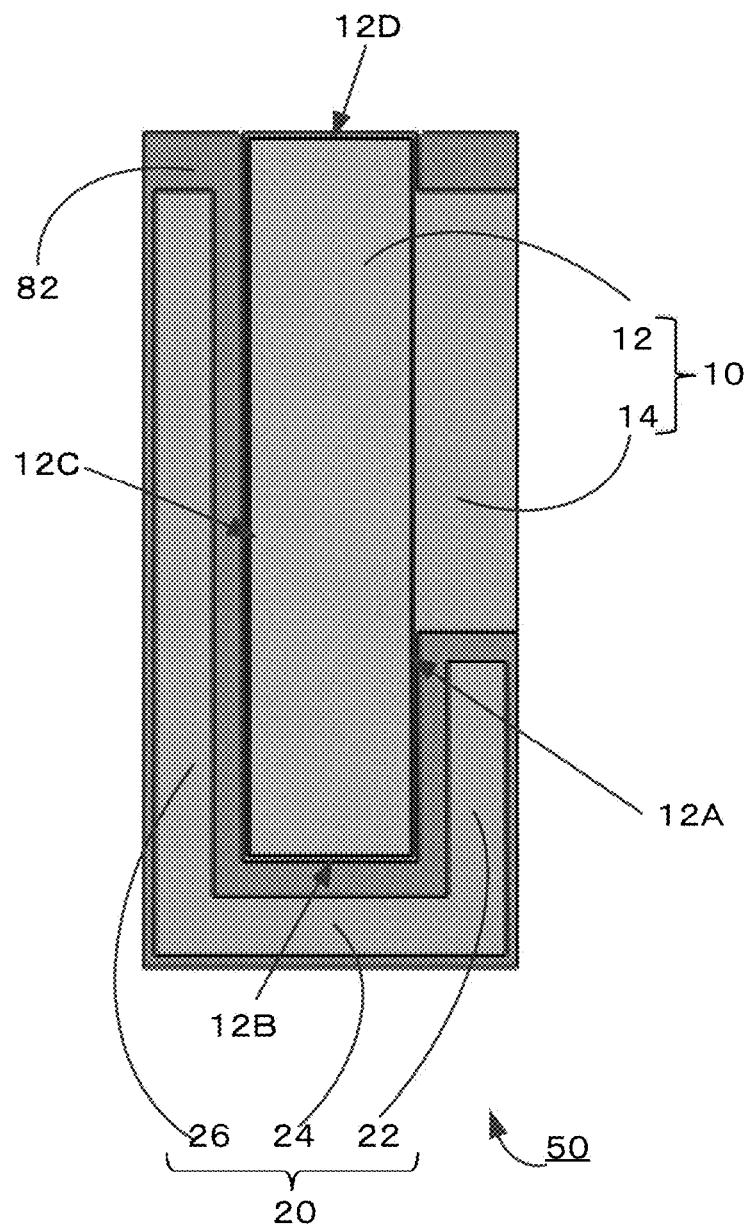
FIG. 1A is a plan view schematically showing a wiring pattern employed in a light emitting device according to a first embodiment.
Figure 1B:
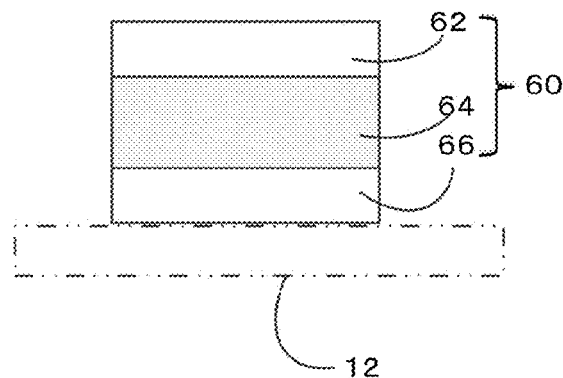
FIG. 1B is a side view schematically showing a light emitting element mounted on the wiring pattern shown in FIG. 1A.

First, with reference to FIGS. 1A and 1B, a description will be given of a wiring pattern 50 employed in a light emitting device 100 according to a first embodiment. FIG. 1A is a plan view schematically showing the wiring pattern, and FIG. 1B is a side view schematically showing a light emitting element mounted on the wiring pattern shown in FIG. 1A. Throughout the embodiments described below, members having the same function are denoted by the same reference numerals.

The wiring pattern 50 is a wiring pattern that is applied for a light emitting element 60 including an upper electrode 62 and a lower electrode 66 disposed on an upper surface and a lower surface of an element body 64, respectively. As shown in FIG. 1A, the wiring pattern 50 is constituted of a conductive pattern made of a conductive material such as gold, nickel, or copper and is disposed on a substrate member 82. The wiring pattern 50 may or may not include the substrate member 82. In more detail, the wiring pattern 50 includes a first conductive pattern 10 that includes: a light emitting element mounting region 12 to which the lower electrode 66 of the light emitting element 60 is connected and which is defined by a first side 12A, a second side 12B, a third side 12C, and a fourth side 12D in sequence in a plan view; and a contact region 14 connected to a portion of the first side 12A of the light emitting element mounting region 12.

The wiring pattern 50 further includes a second conductive pattern 20 that surrounds a portion of the first side 12A where the contact region 14 is not disposed, the entire second side 12B, and a portion of or the entirety of the third side 12C. Accordingly, the second conductive pattern 20 includes a first portion 22 along the first side 12A, a second portion 24 along the second side 12B, and a third portion 26 along the third side 12C.

In the present embodiment, one end portion of the second conductive pattern 20 on a third side 12C side is positioned nearer to the fourth side 12D than another end portion of the second conductive pattern 20 on a first side 12A side to the fourth side 12D. That is, the second conductive pattern 20 has a plan-view shape in which the first portion 22 and the third portion 26, which has a length toward the fourth side 12D greater than that of the first portion 22, are connected to each other via the second portion 24.

Light Emitting Device Using Single Wire for Each Connection

Figure 2A:
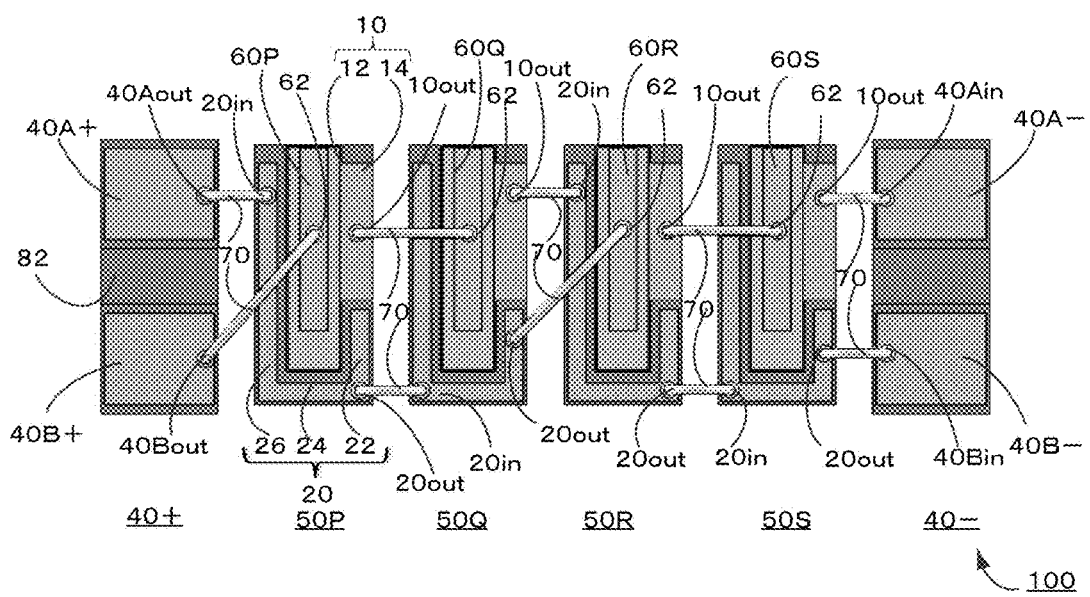
FIG. 2A is a plan view schematically showing the light emitting device according to the first embodiment in an exemplary case in which a single wire is used for each connection.
Figure 2B:
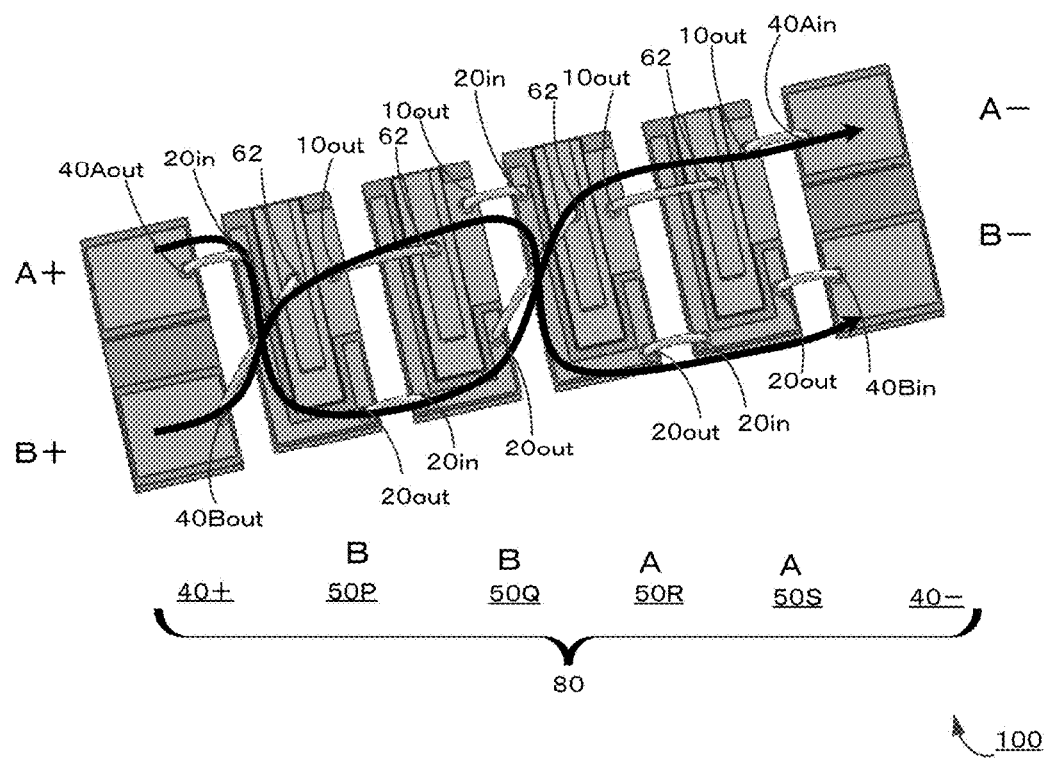
FIG. 2B is a perspective view schematically showing the flow of current in the light emitting device shown in FIG. 2A.

Next, with reference to FIGS. 2A and 2B, a description will be given of the light emitting device 100 that includes wiring patterns 50P to 50S as a plurality of wiring patterns 50. In the light emitting device 100, the contact region 14 of the wiring pattern 50Q and the second conductive pattern 20 of the wiring pattern 50R are connected to each other via a single wire, and the second conductive pattern 20 of the wiring pattern 50Q and the upper electrode 62 of the light emitting element mounted on the wiring pattern 50R are connected to each other via another single wire. FIG. 2A is a plan view schematically showing the light emitting device 100. FIG. 2B is a perspective view schematically showing the flow of current in the light emitting device 100. The bold lines each having an arrow at its tip (bold arrows) shown in FIG. 2B indicate the flow of current.

In the present example, the light emitting device 100 includes a substrate 80 in which four wiring patterns 50P, 50Q, 50R, and 50S are disposed in a line between a terminal 40+ and a terminal 40− disposed at opposite end sides of the substrate 80. On the wiring patterns 50P, 50Q, 50R, and 50S, a plurality of light emitting elements 60 each having the upper electrode 62 and the lower electrode, specifically, four light emitting elements 60P, 60Q, 60R, and 60S, are mounted, respectively. As indicated by bold arrows in FIG. 2B, the light emitting device 100 includes a current system A in which current flows from a terminal 40A+ on a left side of the drawing toward a terminal 40A− on a right side of the drawing, and a current system B in which current flows from a terminal 40B+ on the left side of the drawing to a terminal 40B− on the right side of the drawing. In another embodiments, current may flow in the reverse direction.

In the present example, a semiconductor laser is used for each of the light emitting elements 60. Each of the light emitting elements 60 has, in a lateral surface thereof, a light emitting surface from which laser light is to be emitted, and the light emitting surface is disposed on a fourth side 12D side. Meanwhile, any other appropriate light emitting element such as an LED can be alternatively employed as each of the light emitting elements 60. At least one of the plurality of light emitting elements 60 includes a multilayer structure of a gallium-nitride based semiconductor. The at least one of the light emitting elements 60 including a multilayer structure of a gallium-nitride based semiconductor is preferably junction-down mounted, that is, preferably mounted in a state where the lower electrode 66 is a p-side electrode and the upper electrode 62 is an n-side electrode, which allows for having good heat-dissipation. Alternatively, the at least one of the light emitting elements 60 having such a structure may be mounted in a state where the lower electrode 66 is an n-side electrode and the upper electrode 62 is a p-side electrode. Further, the at least one of the light emitting elements 60 including a multilayer structure of a gallium-nitride based semiconductor may further include a mount member made of aluminum nitride or silicon carbide on a substrate side of the multilayer structure of the gallium-nitride based semiconductor.

FIG. 2A shows the substrate 80 in which each of the wiring patterns 50P to 50S is disposed on respective one of individual substrate members 82 to be juxtaposed to each other, but the present disclosure is not limited thereto, and the substrate 80 may be employed in which the wiring patterns 50 are disposed on a single substrate member 82. The number of the wiring patterns 50 is not limited to four, and any appropriate number of the wiring pattern may be used.

FIG. 2A shows the light emitting device 100 including the substrate 80 on which a plurality of light emitting elements 60P to 60S is disposed, and a plurality of wiring patterns 50P to 50S corresponding to the plurality of light emitting elements 60P to 60S, respectively, is provided at the upper surface of the substrate 80. Each of the plurality of wiring patterns is disposed such that, in two adjacent wiring patterns 50, the first side 12A of one wiring pattern (the wiring pattern on the left side of the FIG. 2A) and the third side 12C of the other wiring pattern (the wiring pattern on the right side of the FIG. 2A) face each other.

Of the plurality of wiring patterns 50P to 50S, the light emitting elements 60P and 60Q disposed on the wiring patterns 50P and 50Q, respectively, are configured to emit light of the same color (e.g., blue-color light), and the light emitting elements 60R and 60S mounted on the wiring patterns 50R and 50S, respectively, are configured to emit light of the same color (e.g., green-color light). Accordingly, the light emitting elements 60P and 60Q are configured to emit light of a color different from a color of light emitted from the light emitting elements 60R and 60S.

The expression "light of the same color" refers to light of a wavelength in a range in which the light can be regarded to have the same color. For example, "blue light" refers to light of a wavelength in a range of 435 nm to 480 nm, "green light" refers to light of a wavelength in a range of 500 nm to 560 nm, and "red light" refers to light of a wavelength in a range of 610 nm to 750 nm. These wavelength ranges are examples, and any appropriate wavelength range can be selected in accordance with the intended use.

In the case where the light emitting elements configured to emit light of the same color and disposed adjacent to each other are controlled to simultaneously emit light, the light emitting elements can be electrically connected in series. On the other hand, in the case where the light emitting elements configured to emit light of different colors and disposed adjacent to each other are controlled separately to individually emit light, the light emitting elements need to be arranged in electrically separate current systems. Accordingly, the wiring patterns 50Q and 50R on which the light emitting elements 60Q and 60R configured to emit light of different colors are arranged need to be arranged in electrically separate current systems.

More specifically, in the wiring pattern (i.e., the first wiring pattern) 50Q and the wiring pattern (i.e., the second wiring pattern) 50R, which are adjacent to each other, the contact region 14 (specifically, a contact 10*out*) of the wiring pattern 50Q (i.e., the first wiring pattern) and the second conductive pattern 20 (specifically, a contact 20*in*) of the wiring pattern 50R (i.e., the second wiring pattern) being adjacent to the wiring pattern 50Q (i.e., the first wiring pattern) at the first side 12A side of the wiring pattern 50Q (i.e., first wiring pattern) are connected to each other via one of the wires 70.

Further, the second conductive pattern 20 (specifically, a contact 20*out*) of the wiring pattern 50Q (i.e., the first wiring pattern) and the upper electrode 62 of the light emitting element 60R disposed on the wiring pattern 50R (i.e., the second wiring pattern) are connected to each other via another one of the wires 70.

On the other hand, the wiring patterns 50P and 50Q, on which the light emitting elements 60P and 60Q configured to emit light of the same color are disposed, respectively, are electrically connected to each other in series, and the wiring patterns 50R and 50S, on which the light emitting elements 60R and 60S configured to emit light of the same color are disposed, respectively, are electrically connected to each other in series.

More specifically, in the wiring pattern 50P (i.e., the third wiring pattern) and the wiring pattern 50Q (i.e., the first wiring pattern), which are adjacent to each other, the contact region 10 (specifically, the contact 10*out*) of the wiring pattern 50P (i.e., the third wiring pattern) and the upper electrode 62 of the light emitting element 60 disposed on the wiring pattern 50Q (i.e., the first wiring pattern) adjacent to the wiring pattern 50P (i.e., the third wiring pattern) at the first side 12A side of the wiring pattern 50P (i.e., the third wiring pattern) are connected to each other via even another one of the wires 70.

Further, the second conductive pattern 20 (more specifically, the contact 20*out*) of the wiring pattern 50P (the third wiring pattern) and the second conductive pattern 20 (specifically, the contact 20*in*) of the wiring pattern 50Q (first wiring pattern) are connected to each other via still another one of the wires 70. Further, similarly, in the wiring pattern 50R (i.e., the second wiring pattern) and wiring pattern 50S (the fourth wiring pattern), which are adjacent to each other, the contact region 10 (specifically, the contact 10*out*) of the wiring pattern 50R (i.e., the second wiring pattern) and the upper electrode 62 of the light emitting element 60S disposed on the wiring pattern 50S (i.e., the fourth wiring pattern) adjacent to the wiring pattern 50R (i.e., the second wiring pattern) at the first side 12A side of the wiring pattern 50R (i.e., the second wiring pattern) are connected to each other via yet another one of the wires 70, and the second conductive pattern 20 (specifically, the contact 20*out*) of the wiring pattern 50R (i.e., the second wiring pattern) and the second conductive pattern 20 (specifically, the contact 20*in*) of the wiring pattern 50S (the fourth wiring pattern) are connected to each other via further another one of the wires 70.

In the system A, a contact 40Aout of the terminal 40A+ on the left side of FIG. 2A and the contact 20*in* of the second conductive pattern 20 of the wiring pattern 50P are connected to each other via still further another one of the wires 70, and the contact 10*out* of the contact region 10 of the wiring pattern 50S on the right side of FIG. 2A and a contact 40Ain of the terminal 40A− are connected to each other via yet further another one of the wires 70. Similarly, in the system B, a contact 40Bout of the terminal 40B+ on the left side of FIG. 2A and the upper electrode 62 of the light emitting element 60P mounted on the wiring pattern 50P are connected to each other via yet still further another one of the wires 70, and the contact 20*out* of the second conductive pattern 20 of the wiring pattern 50S on the right side of FIG.

2A and the contact 40Ain of the terminal 40B– are connected to each other via the other one of the wires 70.

With the wirings as described above, as indicated by the bold lines each having an arrow at its tip as shown in FIG. 2B, the light emitting elements 60P and 60Q disposed on the wiring patterns 50P and 50Q, respectively, are configured to emit light by current in the current system B. On the other hand, the light emitting elements 60R and 60S disposed on the wiring patterns 50R and 50S, respectively, emit light by current in the current system A. Control of light emission from the light emitting elements 60P and 60Q can be performed separately from control of light emission from the light emitting elements 60R and 60S, so that the light emitting device 100 configured to emit light of desired color can be realized.

Light Emitting Device Using Plurality of Wires for Each Connection

Next, with reference to FIGS. 3A and 3B, a description will be given of a light emitting device 200 in which a plurality of wires is used for each connection. In the light emitting device 200, the contact region 14 of the wiring pattern 50Q and the second conductive pattern 20 of the wiring pattern 50R are connected to each other via a plurality of wires, and the second conductive pattern 20 of the wiring pattern 50Q and the upper electrode 62 of the light emitting element 60R disposed on the wiring pattern 50R are connected to each other via another plurality of wires. FIG. 3B is a perspective view schematically showing the flow of current in the light emitting device 200 shown in FIG. 3A. The bold lines each having an arrow at its tip (i.e., bold arrows) shown in FIG. 3B indicates the flow of current.

Figure 3A:
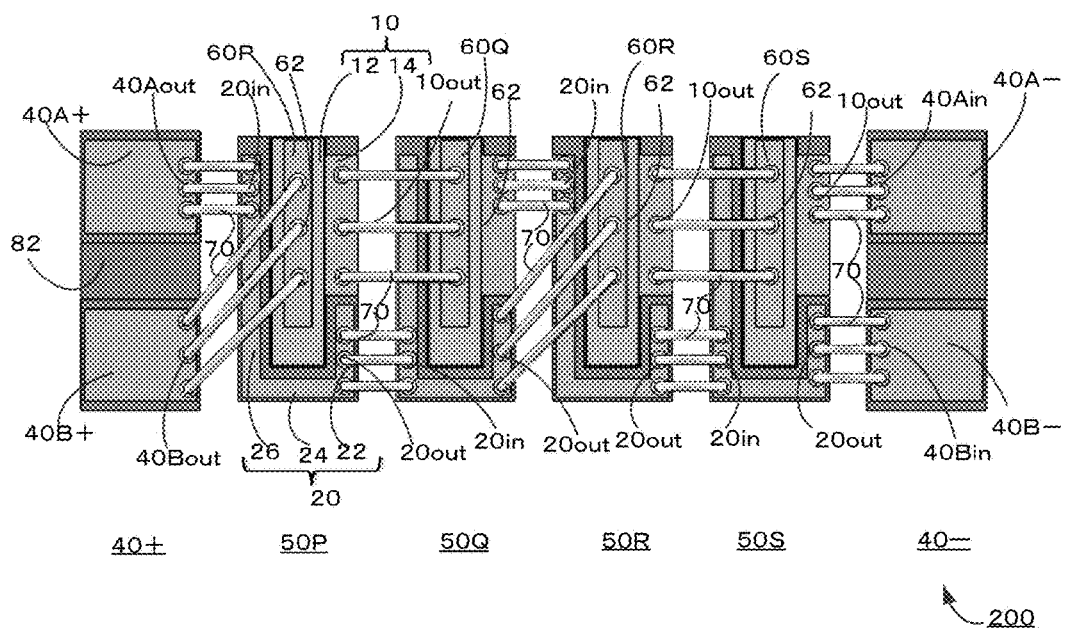
FIG. 3A is a plan view schematically showing the light emitting device according to the first embodiment in an exemplary case in which a plurality of wires are used for each connection.
Figure 3B:
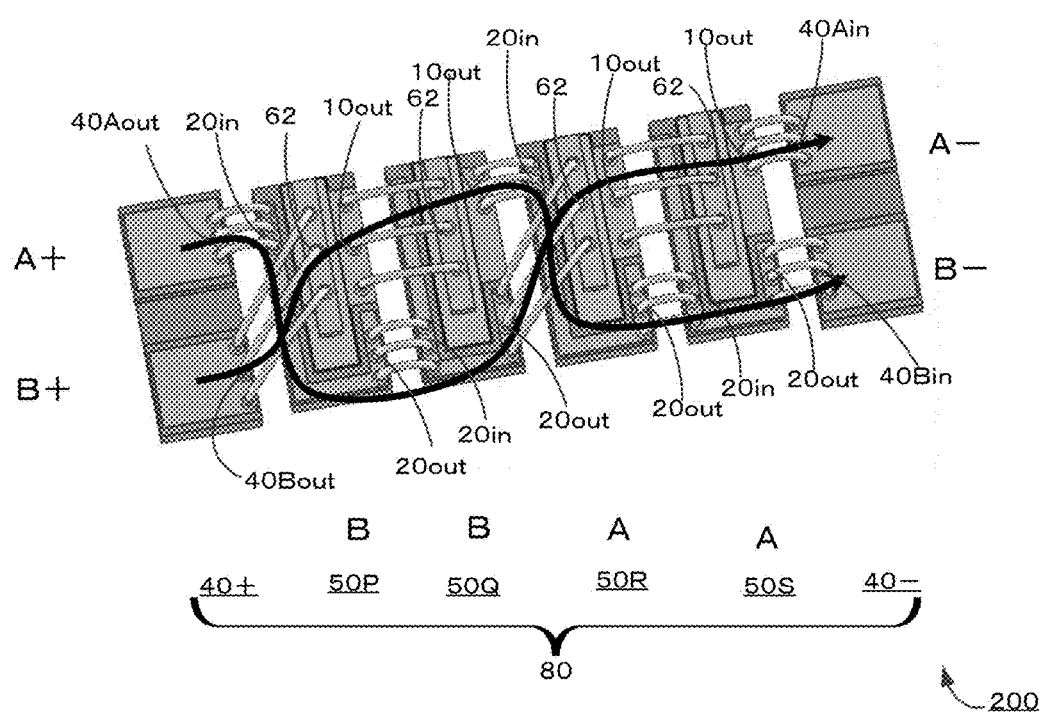
FIG. 3B is a perspective view schematically showing the flow of current in the light emitting device shown in FIG. 3A.

The example shown in FIGS. 3A and 3B is different from the example shown in FIGS. 2A and 2B where electrical connection between respective corresponding ones of the contacts and electrical connection between the upper electrode of each of the light emitting elements and a corresponding one of the contacts are respectively achieved by a single wire 70, in that such electrical connections are respectively achieved by three wires 70. The present example in which a plurality of wires 70 is used for each connection is suitable to the case where high-output light emitting elements are used through which a large current are to be flown. The plurality of wires 70 can be used for each connection in accordance with a length of each of the contact regions 10, and the length of the first portion 22 and the third portion 26 of respective one of the second conductive pattern 20. Other configurations in the present example is basically similar to the example shown in FIGS. 2A and 2B and, therefore, duplicative description thereof will be omitted.

In the wiring pattern 50 according to the present disclosure including other embodiments described below, one end portion of the second conductive pattern 20 at the third side 12C side is located nearer to the fourth side 12D than other end of the second conductive pattern 20 at the first side 12A side is to the fourth side 12D. This structure allows for effectively preventing interference between the wires 70 even in the case where an electrical connection between respective corresponding ones of the contacts and electrical connection between the upper electrode of each of the light emitting elements and a corresponding one of the contacts are respectively achieved by a plurality of wires 70.

Figure 4:
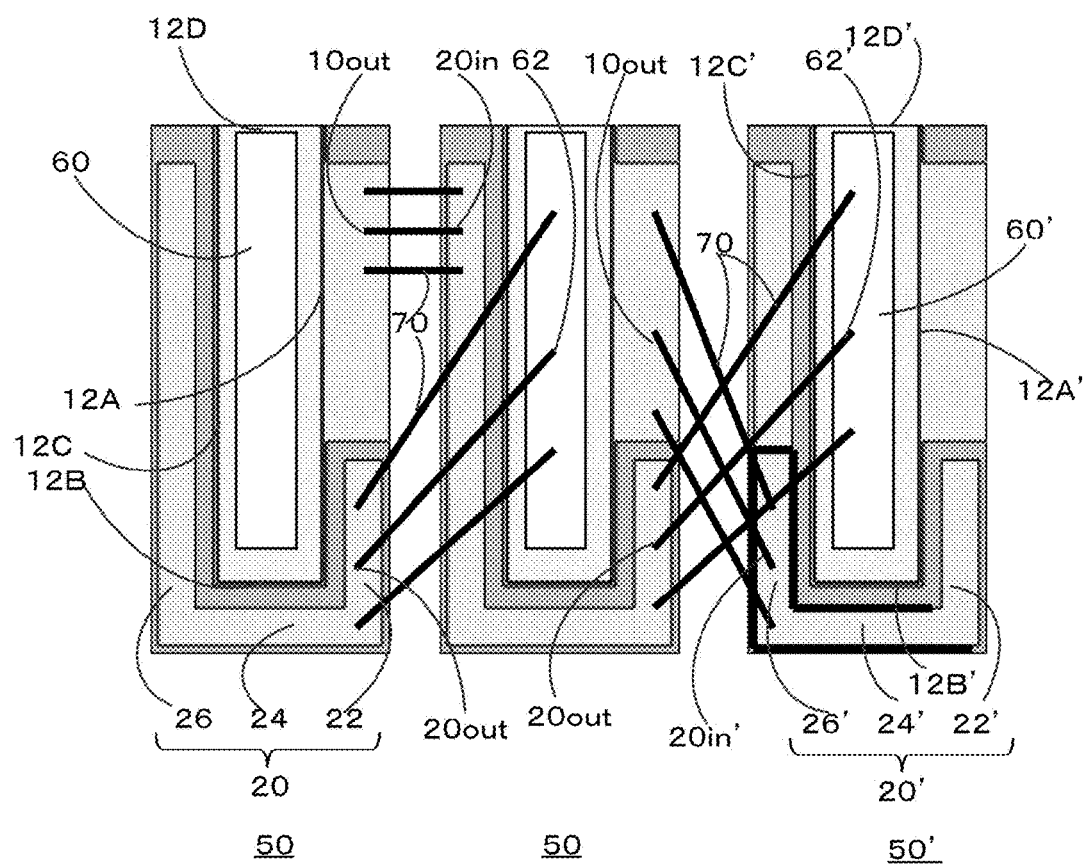
FIG. 4 is a plan view schematically showing the arrangement of wires connecting light emitting elements disposed adjacent to each other.

This will be described below with reference to FIG. 4. FIG. 4 is a plan view schematically showing arrangement of wires connecting the light emitting elements disposed adjacent to each other. In each of the wiring patterns 50 on the left side of FIG. 4 and at the center of FIG. 4, one end portion of the second conductive pattern 20 positioned at the third side 12C side is positioned nearer to the fourth side 12D than another end portion of the second conductive pattern 20 positioned on the first side 12A side to the fourth side 12D. That is, the second conductive pattern 20 has a substantially J-shape in which the third portion 26 extends farther toward the fourth side 12D than the first portion 22 toward the fourth side 12D than toward the fourth side 12D. On the other hand, in a wiring pattern 50' on the right side of FIG. 4, one end portion of a second conductive pattern 20' positioned at a third side 12C' side and another end portion of the second conductive pattern 20' positioned at a first side 12A' side are located substantially at the same position with respect to a fourth side 12D'. That is, the second conductive pattern 20' includes a third portion 26' that extends toward the fourth side 12D' side at a length similar to a length at which the first portion 22' extends toward the fourth side 12D' side.

In the case where adjacent wiring patterns are arranged in electrically separate current systems, the contact 10*out* of the wiring pattern 50 on the left side in FIG. 4 (i.e., the first wiring pattern) and the contact 20*in* of the wiring pattern 50 at the center of FIG. 4 (i.e., the second wiring pattern) are electrically connected to each other, and the contact 20*out* of the wiring pattern 50 on the left side of FIG. 4 (i.e., the first wiring pattern) and the upper electrode 62 of the light emitting element 60 mounted on the wiring pattern 50 at the center of FIG. 4 (i.e., the second wiring pattern) are electrically connected to each other.

Accordingly, between the wiring patterns 50 on the left side of FIG. 4 and at the center of FIG. 4, with the contact 20*in* of the wiring pattern 50 at the center of FIG. 4 (i.e., the second wiring pattern) being disposed at an end part of the third portion 26 at the fourth side 12D side, ones of the wires 70 that connect the contact 10*out* of the wiring pattern 50 on the left side of FIG. 4 and the contact 20*in* of the wiring pattern 50 at the center of FIG. 4 and other ones of the wires 70 that connects the contact 20*out* of the wiring pattern 50 on the left side of FIG. 4 and the upper electrode 62 of the light emitting element 60 mounted on the wiring pattern 50 at the center of FIG. 4 can be prevented from interference with each other, and thus can be efficiently disposed.

On the other hand, between the wiring pattern 50 at the center of FIG. 4 and the wiring pattern 50' on the right side of FIG. 4, a contact 20*in*' of the wiring pattern 50' on the right side of FIG. 4 (i.e., the second wiring pattern) is disposed at the second side 12B side of the third portion 26. Accordingly, even other ones of the wires 70 connecting the contact 10*out* of the wiring pattern 50 at the center of FIG. 4 and the contact 20*in*' of the wiring pattern 50' on the right side of FIG. 4 and still other ones of the wires 70 connecting the contact 20*out* of the wiring pattern 50 at the center of FIG. 4 and the upper electrode 62' of the light emitting element 60' mounted on the wiring pattern 50' on the right side of the drawing interfere with each other.

As has been described above, the wiring pattern 50Q (i.e., the first wiring pattern) and the wiring pattern 50R adjacent thereto (i.e., the second wiring pattern) shown in each of FIG. 2A and FIG. 3A can also be described as below with reference to FIGS. 1A, 2A, and 3A.

Each of the light emitting device 100 and the light emitting device 200 includes a plurality of light emitting elements 60P to 60S each having the upper electrode 62 and the lower electrode 66, and the substrate 80 on which the plurality of light emitting elements 60P to 60S are mounted and that includes a plurality of wiring patterns 50P to 50S at the upper surface of the substrate 80 respectively corresponding to respective one of the plurality of light emitting elements 60P to 60S. Each of the plurality of wiring patterns 50P to 50S includes the first conductive pattern 10 that includes: the light emitting element mounting region 12 to which the lower electrode 66 of respective one of the light emitting elements 50P to 50S is connected and which is defined by the first, second, third, and fourth sides 12A to 12D in sequence in a plan view; and the contact region 14 connected to a portion of the first side 12A of the light emitting element mounting region. Each of the plurality of wiring patterns 50P to 50S further includes the second conductive pattern 20 that surrounds a portion of the first side 12A where the contact region 14 is not present, the entirety of the second side 12B, and a portion of or the entirety of the third side 12C. One end portion of the second conductive pattern 20 on the third side 12C side is positioned nearer to the fourth side 12D than another end portion of the second conductive pattern 20 on the first side 12A side is to the fourth side 12D. The first side 12A of one of the wiring patterns and the third side 12C of another one of the wiring patterns are disposed so as to face each other. The plurality of wiring patterns 50P to 50S includes the first wiring pattern 50Q that corresponds to the light emitting element 60Q, which is one of the plurality of light emitting elements, and the second wiring pattern 50R that corresponds to the light emitting element 60R, which is another one of the plurality of light emitting elements configured to emit light of a color different from a color of light emitted by the light emitting element 60Q. The second wiring pattern 50R is adjacent to the first wiring pattern 50Q on the first side 12A side of the first wiring pattern. The contact region 14 of the first wiring pattern 50Q and the second conductive pattern 20 of the second wiring pattern 50R are connected to each other via at least one wire 70. The second conductive pattern 20 of the first wiring pattern 50Q and the upper electrode 62 of the light emitting element 60R disposed on the second wiring pattern 50R are connected to each other via another at least one wire 70.

In this manner, in the light emitting devices 100, 200 according to certain embodiments or examples described above, the second conductive pattern 20 is disposed to surround the light emitting element mounting region 12. Thus, the space defined by the light emitting element 60, in particular, a portion of the space along the dimension of the first side 12A and the third side 12C can be utilized for the space where the wires 70 are disposed. This does not require disposing of the wiring patterns at the position spaced apart from an array of the light emitting elements 60, and compact wiring patterns can be realized. In particular, with one end portion of the second conductive pattern 20 at the third side 12C side being disposed nearer to the fourth side 12D than another end of the second conductive pattern 20 at the first side 12A side is to the fourth side 12D, a compact light emitting device 100 having compact wiring patterns 50 in which interference between wires 70 is avoided can be realized even in the case where the light emitting elements 60 emitting light in different colors are disposed adjacent to each other.

Similarly, the wiring pattern 50P (i.e., the third wiring pattern) and the wiring pattern 50Q (i.e., the first wiring pattern), which are adjacent to each other, or the wiring pattern 50R (i.e., the second wiring pattern) and the wiring pattern 50S (i.e., the fourth wiring pattern), which are adjacent to each other, shown in FIG. 2A and FIG. 3A can also be described as below with reference to FIGS. 1A, 2A, and 3A.

Each of the light emitting device 100 and 200 includes a plurality of light emitting elements 60P to 60S each having the upper electrode 62 and the lower electrode 66, and the substrate 80 on which the plurality of light emitting elements 60P to 60S is mounted and that includes a plurality of wiring patterns 50P to 50S at the upper surface of the substrate 80 respectively corresponding to respective one of the plurality of light emitting elements 60P to 60S. Each of the plurality of wiring patterns 50P to 50S includes the first conductive pattern 10 for a light emitting element that includes: the light emitting element mounting region 12 to which the lower electrode 66 of respective one of the light emitting elements 60P to 60S is connected and which is defined by the first, second, third, and fourth sides 12A to 12D in sequence in a plan view; and the contact region 14 connected to a portion of the first side 12A of the light emitting element mounting region 12. Each of the plurality of wiring patterns 50P to 50S further includes the second conductive pattern 20 that surrounds a portion of the first side 12A where the contact region 14 is not present, the entirety of second side 12B, and a portion of or the entirety of third side 12C. One end portion of the second conductive pattern 20 at the third side 12C side is positioned nearer to the fourth side 12D than another end portion of the second conductive pattern 20 positioned on the first side 12A is to the fourth side 12D. Two adjacent ones of the wiring patterns 50 are arranged such that the first side 12A of one of the wiring patterns and the third side 12C of another one of the wiring patterns are disposed to face each other. The plurality of wiring patterns 50 further includes the third wiring pattern 50P that corresponds to a light emitting element configured to emit light of a color same as a color of light emitted by the light emitting element 60Q, which corresponds to the first wiring pattern 50Q, and adjacent to the first wiring pattern 50Q at the third side 12C side of the first wiring pattern 50Q. The contact region 14 of the third wiring pattern 50P and the upper electrode 62 of the light emitting element 60Q disposed on the first wiring pattern 50Q are connected to each other via at least one of the wires 70. The second conductive pattern 20 of the third wiring pattern 50P and the second conductive pattern 20 of the first wiring pattern 50Q are connected to each other via another at least one of the wires 70. Further, the plurality of wiring patterns 50 further includes the fourth wiring pattern 50S that corresponds to a light emitting element configured to emit light of a color same as a color of light emitted by the light emitting element 60R, which corresponds to the second wiring pattern 50R, and adjacent to the second wiring pattern 50R at the first side 12A side of the second wiring pattern 50R. The contact region 14 of the second wiring pattern 50R and the upper electrode 62 of the light emitting element 60S disposed on the fourth wiring pattern 50S are connected to each other via even another at least one of the wires 70. The second conductive pattern 20 of the second wiring pattern 50R and the second conductive pattern of the fourth wiring pattern 50S are connected to each other via still another at least one of the wires 70.

In this manner, adjacent light emitting elements 60 can be electrically connected in series or can be arranged in separate current systems using the same wiring patterns 50, which allows for providing a compact light emitting device that can emit light of various colors at desired timing at low manufacturing costs.

With the same wiring patterns 50, a single wire 70 or a plurality of wires 70 may be used for connecting respective corresponding ones of the contacts to each other or connecting each of the electrodes and a corresponding one of the contacts may be achieved by using. Accordingly, the optimum wiring can be efficiently achieved in accordance with drive current of the light emitting elements 60.

As described above, a lateral surface of the light emitting element 60 includes a light emitting surface, and the light emitting surface is disposed at the fourth side 12D side. The wiring pattern 50 is disposed at the first side 12A side, the second side 12B, and the third side 12C, excluding the fourth side 12D. With this arrangement, the light emitting device 100 of high-performance can be realized in which interference of emitted light by the wiring patterns 50 or the wires 70 can be prevented.

Figure 8:
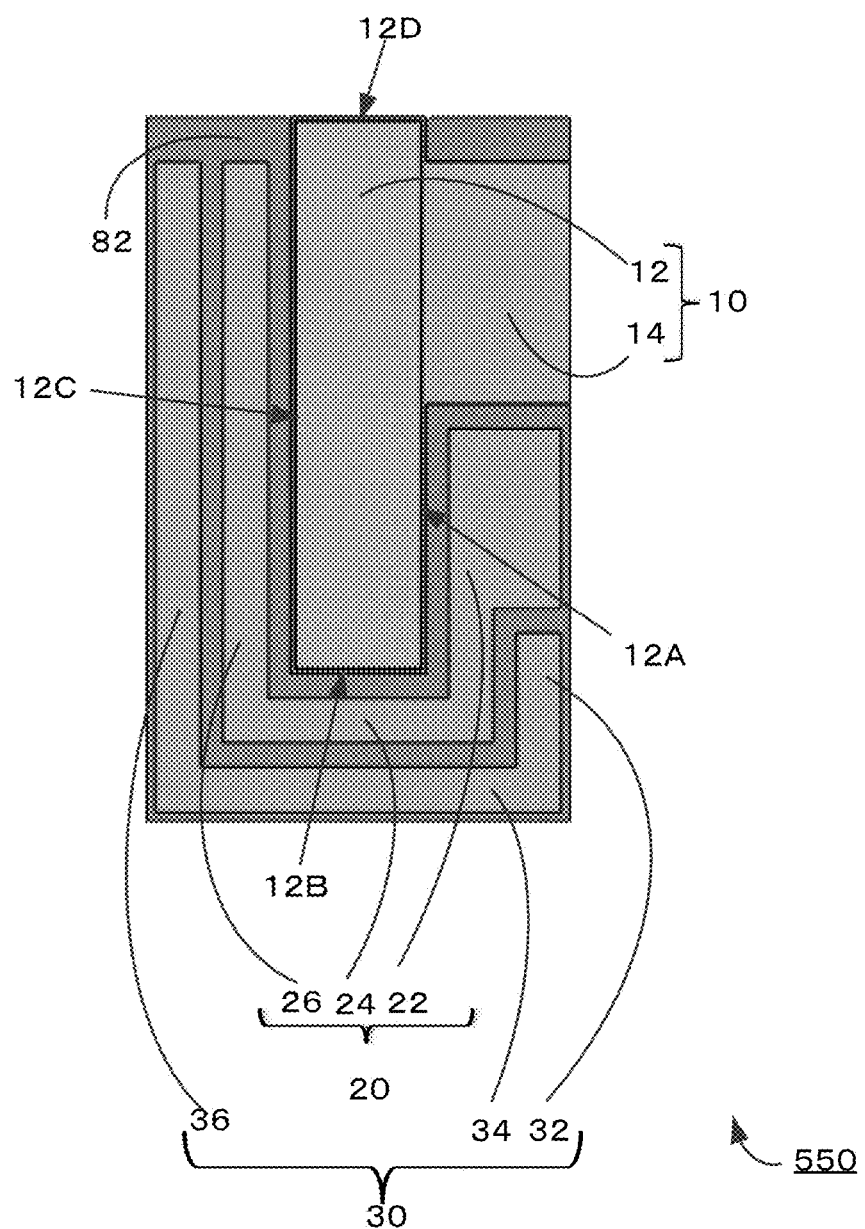
FIG. 8 is a plan view schematically showing a wiring pattern employed in a light emitting device according to a third embodiment.

Alternatively, a plurality of conductive patterns such as shown in FIG. 8 may surround the light emitting element mounting region 12 of the first conductive pattern 10.

Case of Using Bypassing Wire

Figure 5A:
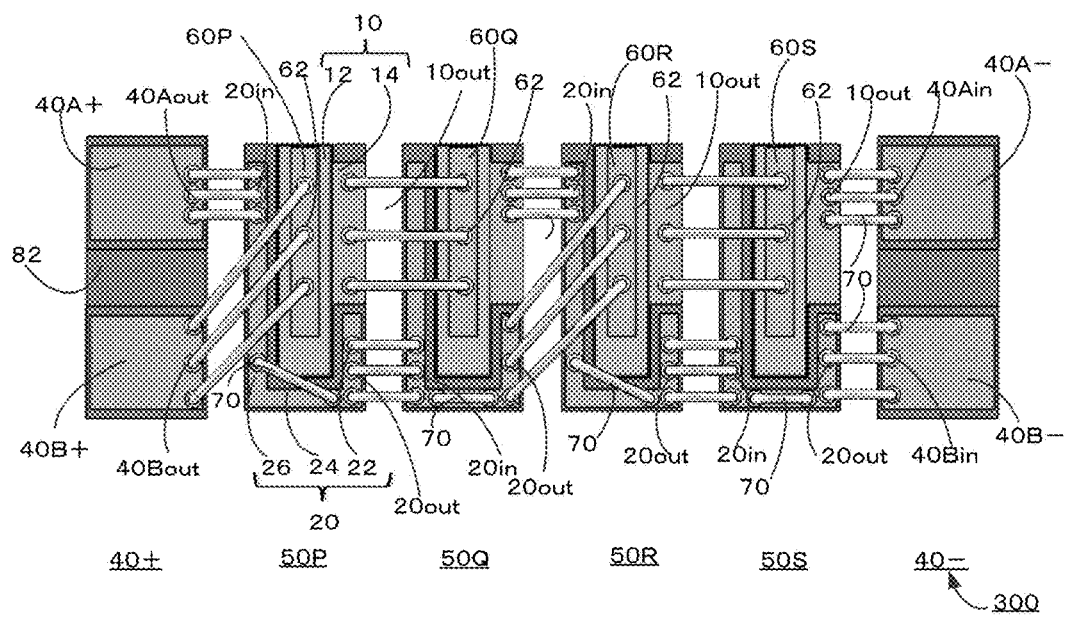
FIG. 5A is a plan view schematically showing the light emitting device according to the first embodiment in an exemplary case in which a bypassing wire is used on each of second conductive patterns.
Figure 5B:
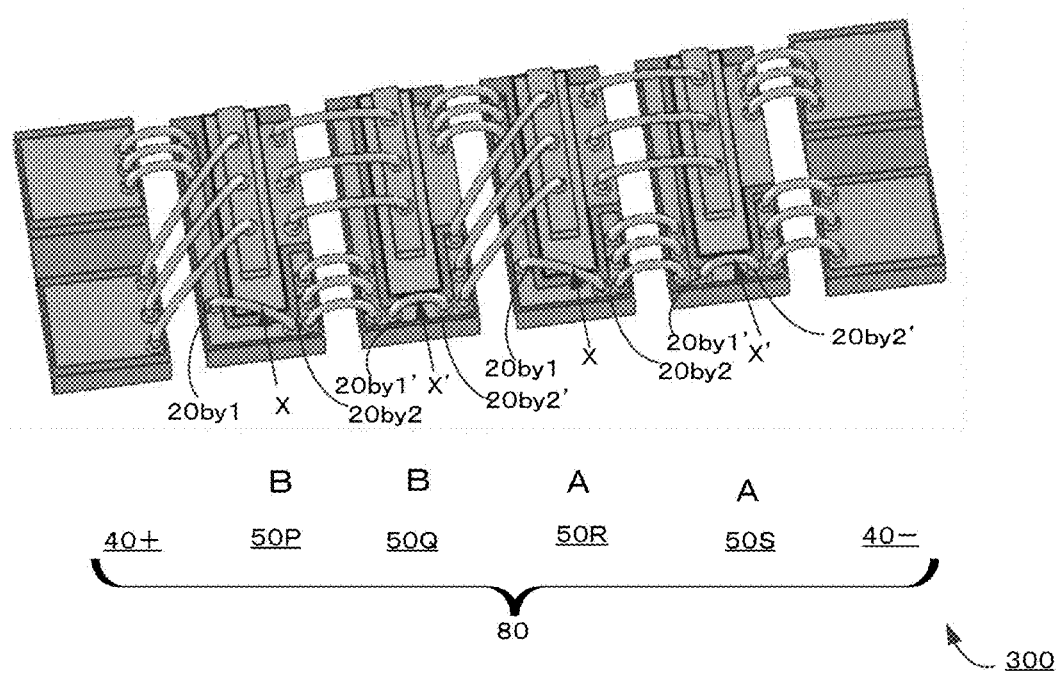
FIG. 5B is a perspective view for describing arrangement of the bypassing wire in the light emitting device shown in FIG. 5A.

Next, with reference to FIGS. 5A and 5B, a description will be given of a light emitting device 300 including wires for bypassing. FIG. 5A is a plan view schematically showing the light emitting device 300 using the wiring patterns according to the first embodiment of the present disclosure, schematically showing an example in which bypassing wires are disposed at the second conductive patterns. FIG. 5B is a perspective view for describing the bypassing wires in the light emitting device 300 shown in FIG. 5A.

In the example shown in FIGS. 5A and 5B, a plurality of wires 70 are used each of connections between corresponding ones of the wiring patterns 50P to 50S, basically similarly to the example shown in FIGS. 3A and 3B. A difference between this example and the example shown in FIGS. 3A and 3B is that, in FIGS. 5A and 5B, bypassing wires 70 are disposed on each of the wiring patterns 50P to 50S. The bypassing wires 70 will be described below. Other configurations of the light emitting device 300 are similar to the description above and, therefore, duplicative description thereof will be omitted.

The bypassing wires 70 that are indicated by arrow X and X' in FIG. 5B, are respectively disposed on the second conductive pattern 20 of each of the wiring patterns 50 to connect two portions of the second conductive pattern 20 thereof. In more detail, the light emitting device 300 includes the bypassing wires 70 indicated by arrows X each connecting a contact 20by1 and a contact 20by2 to each other, and the bypassing wires 70 indicated by arrows X' each connecting a contact 20by1' and a contact 20by2' to each other. With the bypassing wires 70 respectively connecting two portions in respective one of the second conductive patterns 20, the cross-sectional area of the wire 70 in addition to the cross-sectional area of the conductive layer of the second conductive pattern 20 can be the cross-sectional area through which current flows, so that electrical resistance can be reduced. The cross-sectional area of each of the bypassing wires 70 is preferably greater than the cross-sectional area of the conductive layer forming respective one of the second conductive patterns 20, but the electrical resistance can be reduced even if it is not greater.

Accordingly, the present example is particularly effective in the case of using high-output light emitting elements through which a large current is to be flown. In the example shown in FIGS. 5A and 5B, a single bypassing wire 70 is used with respect to each of the second conductive patterns 20, but two portions in each of the second conductive patterns 20 may be connected to each other via a plurality of wires 70.

Light Emitting Device According to Second Embodiment of Present Disclosure

Figure 6:
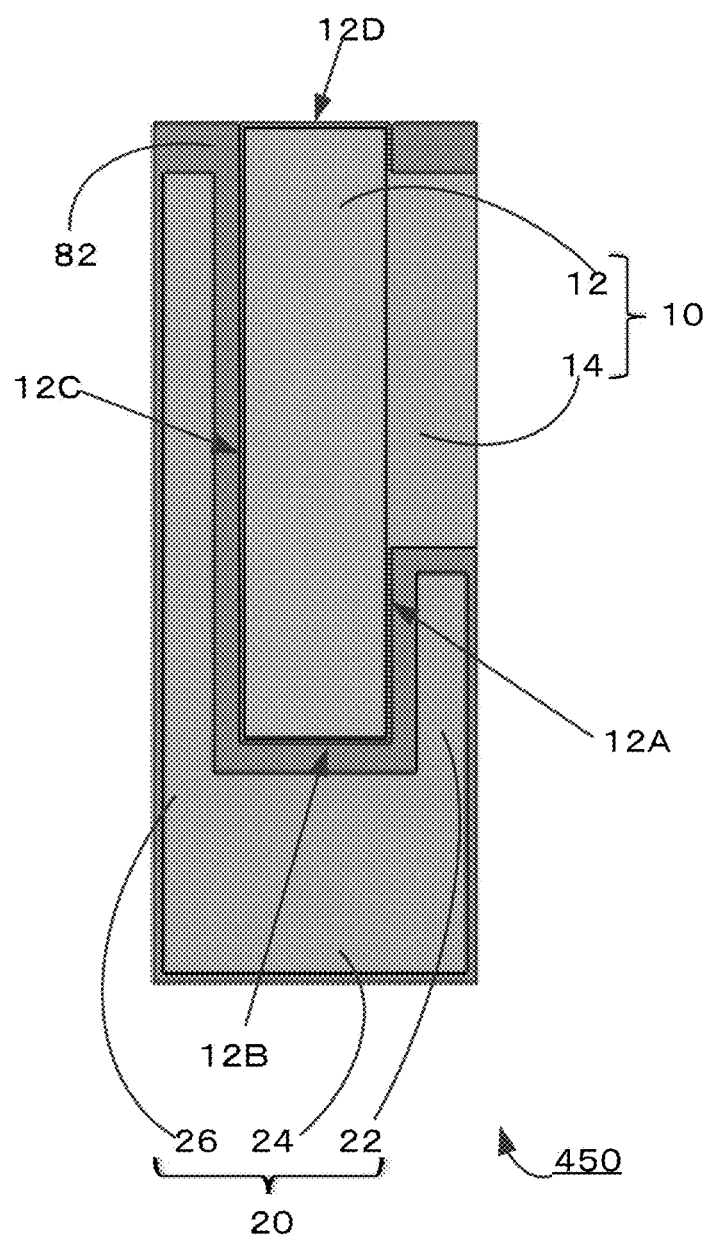
FIG. 6 is a plan view schematically showing a wiring pattern employed in a light emitting device according to a second embodiment.

Next, with reference to FIG. 6, a description will be given of a wiring pattern 450 used for a light emitting device 400 according to a second embodiment of the present disclosure. FIG. 6 is a plan view schematically showing the wiring pattern 450 according to the second embodiment of the present disclosure.

The wiring patterns 450 used in the light emitting device 400 according to the present embodiment is different from the wiring pattern used in the light emitting device according to the first embodiment shown in FIG. 1A in that the second portion 24 along the second side 12B of the second conductive pattern 20 extends outward (i.e., in the direction away from the light emitting element mounting region 12). Connection using the wire 70 in the second portion 24 having an enlarged area will be described below. Other configurations of the light emitting device 400 is similar to the description above and, therefore, duplicative description thereof will be omitted.

Light Emitting Device Using Plurality of Wires

Figure 7A:
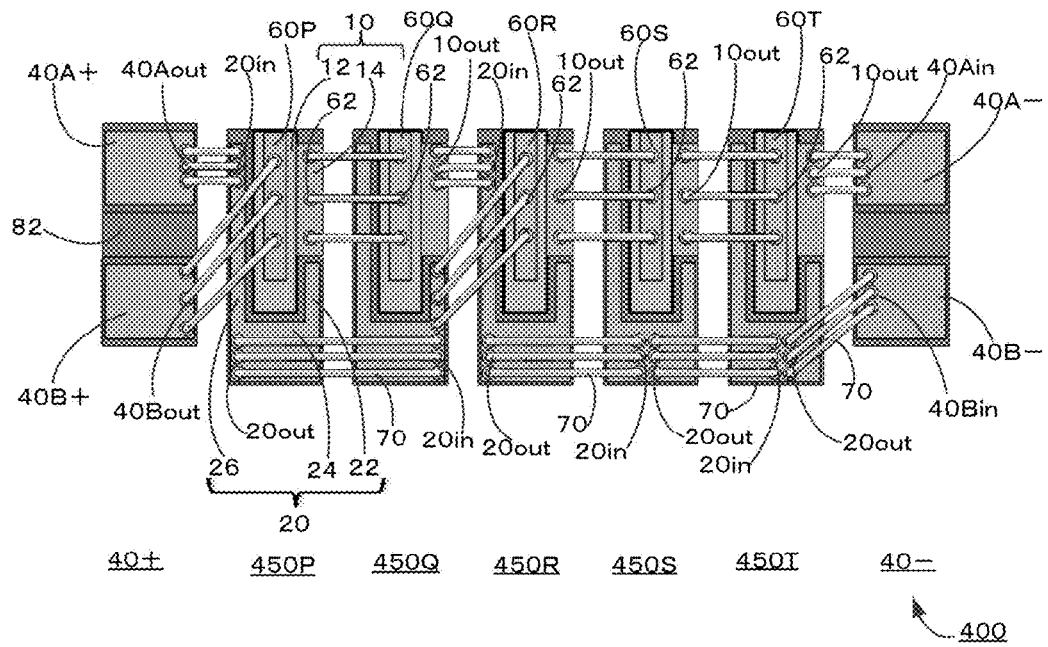
FIG. 7A is a plan view schematically showing the light emitting device according to the second embodiment in an exemplary case in which a plurality of wires is used for each connection.
Figure 7B:
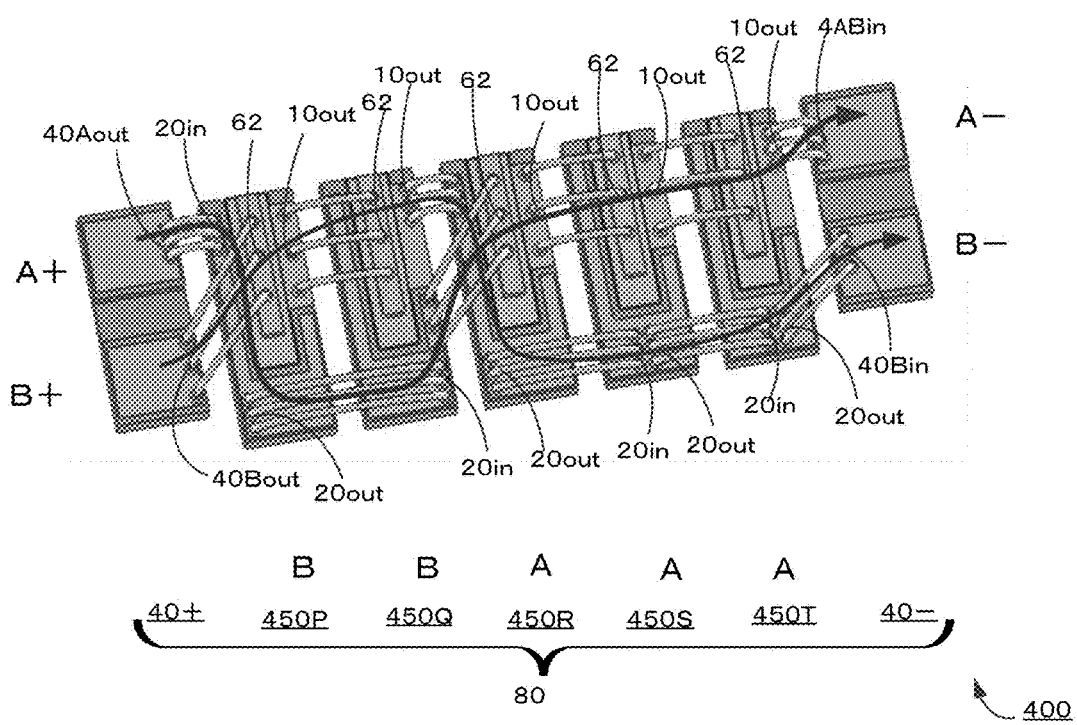
FIG. 7B is a perspective view schematically showing the flow of current in the light emitting device shown in FIG. 7A.

Next, with reference to FIGS. 7A and 7B, a description will be given of the light emitting device 400 according to a second embodiment of the present disclosure. An exemplary case where respective corresponding ones of the wiring patterns are connected using a plurality of wires will be described below, but the present embodiment is applicable also to a case where a single wire is used for such connection. FIG. 7A is a plan view schematically showing the light emitting device 400. In the light emitting device 400, the contact region 14 of the wiring pattern 450Q and the second conductive pattern 20 of the wiring pattern 450R are connected to each other via a plurality of wires, and the second conductive pattern 20 of the wiring pattern 450Q and the upper electrode 62 of the light emitting element disposed on the wiring pattern 450R are connected to each other via another plurality of wires. FIG. 7B is a perspective view schematically showing the flow of current in the light emitting device 400 shown in FIG. 7A. In FIG. 7B, bold lines each having an arrow at its tip (i.e., bold arrows) shown indicate flow of current. Further, as to other wiring patterns, connection between respective adjacent wiring patterns, that is, connection between the wiring patterns 450P and 450Q, connection between wiring patterns 450R and 450S, and wiring patterns 450S and 450T, are respectively achieved by connecting the second conductive pattern of one of the wiring patterns and the second conductive pattern of the other of the wiring patterns via even another plurality of wires and connecting the contact region of one of the wiring patterns and the upper electrode of the light emitting element on the other of the wiring patterns via still another plurality of wires.

In the light emitting device 400 shown in FIGS. 7A and 7B, the second portion 24 of the second conductive pattern 20 of each of the wiring patterns 450P to 450T has an area extended outward, the plurality of wires 70 for connecting respective adjacent ones of the wiring patterns 450P to 450T can be disposed using the second portion 24. In the second conductive pattern 20 of the wiring pattern 450 according to the first embodiment shown in FIGS. 3A and 3B, current flows throughout the second conductive pattern 20 from one end to other end, that is, from the contact 20in positioned on the fourth side 12D side of the third portion 26 to the contact 20out of the first portion 22.

Meanwhile, in the second conductive pattern 20 of each of the wiring patterns 450P to 450T according to the second embodiment shown in FIGS. 7A and 7B, current flows from the contact 20*in* positioned on the fourth side 12D side of the third portion 26 to the contact 20*out* of the second portion 24 through the second conductive pattern 20, and thereafter flows into the adjacent wiring pattern 450 via the wires 70. Accordingly, the distance inside the second conductive pattern 20 where the current flows can be reduced, and corresponding ones of the wires 70 through which current thereafter flows respectively have a greater cross-sectional area, so that electric resistance can be reduced. Therefore, the present example is also effective in the case of using high-output light emitting elements through which a large current needs to flow.

In particular, in the second conductive pattern 20, the input-side contact 20*in*, at which current flows in from adjacent one of the wiring patterns 450 at the terminal 40+ side via corresponding ones of the wires 70, and the output-side contact 20*out*, at which current flows to adjacent one of the wiring patterns 450 via corresponding ones of the wires 70 at the terminal 40− side, are disposed next to each other (for example, see the circuit patterns 450R, 450S, 450T), so that the electric resistance can be effectively reduced.

Light Emitting Device According to Third Embodiment

Next, with reference to FIG. 8, a description will be given of a light emitting device 500 according to a third embodiment. FIG. 8 is a plan view schematically showing the wiring patterns used in the light emitting device 500 according to the third embodiment of the present disclosure.

The wiring patterns 550 used in the light emitting device 500 according to the present embodiment is different from the above-described wiring patterns according to each of the first and second embodiments in that a first second conductive pattern 20 and a second third conductive pattern 30 of each of the wiring patterns 550 are disposed to surround the light emitting element mounting region 12.

In more detail, similarly to the above-described wiring patterns, each of the wiring patterns 550 includes the first conductive pattern 10 that includes: the light emitting element mounting region 12 to which a lower electrode of a light emitting element is connected, and which is defined by the first side 12A, the second side 12B, the third side 12C, and the fourth side 12D in sequence in a plan view; and the contact region 14 connected to a portion of the first side 12A of the light emitting element mounting region 12.

Each of the wiring patterns 550 further includes the first second conductive pattern 20 and the second third conductive pattern 30 that surround a portion of the first side 12A where the contact region 14 is not present, the entirety of the second side 12B, and a portion of or the entirety of the third side 12C. The second third conductive pattern 30 is disposed on the outer side of the first second conductive pattern 20 to be spaced apart therefrom at a predetermined distance.

The first second conductive pattern 20 includes the first portion 22, the second portion 24, and the third portion 26 along the first side 12A, the second side 12B, and the third side 12C, respectively. Further, the second third conductive pattern 30 is includes a first portion 32, a second portion 34, and a third portion 36 along the outer sides of the first portion 22, the second portion 24, and the third portion 26, respectively.

In the second and third conductive patterns 20 and 30, one end of the second and third conductive patterns 20, 30 on the third side 12C side is positioned nearer to the fourth side 12D than another end of the second and third conductive patterns 20, 30 at the first side 12A side is to the fourth side 12D. That is, each of the second and third conductive patterns 20, 30 has a planar shape in which the first portion 22, 32 and the third portion 26, 36 extending toward the fourth side 12D farther than the first portion 22, 32 does toward the fourth side 12D are connected to each other via the second portion 24, 34, respectively.

A connection by the wire between adjacent ones of the wiring patterns 550 can be achieved by connecting corresponding ones of the second and third conductive patterns 20 and 30 via the wire 70 as in the above-described connection achieved by the wires 70 between the wiring patterns. Accordingly, a further detailed description of a connection using the wires 70 will not be repeated.

Light Emitting Device Using Single Wire for Each Connection

Figure 9A:
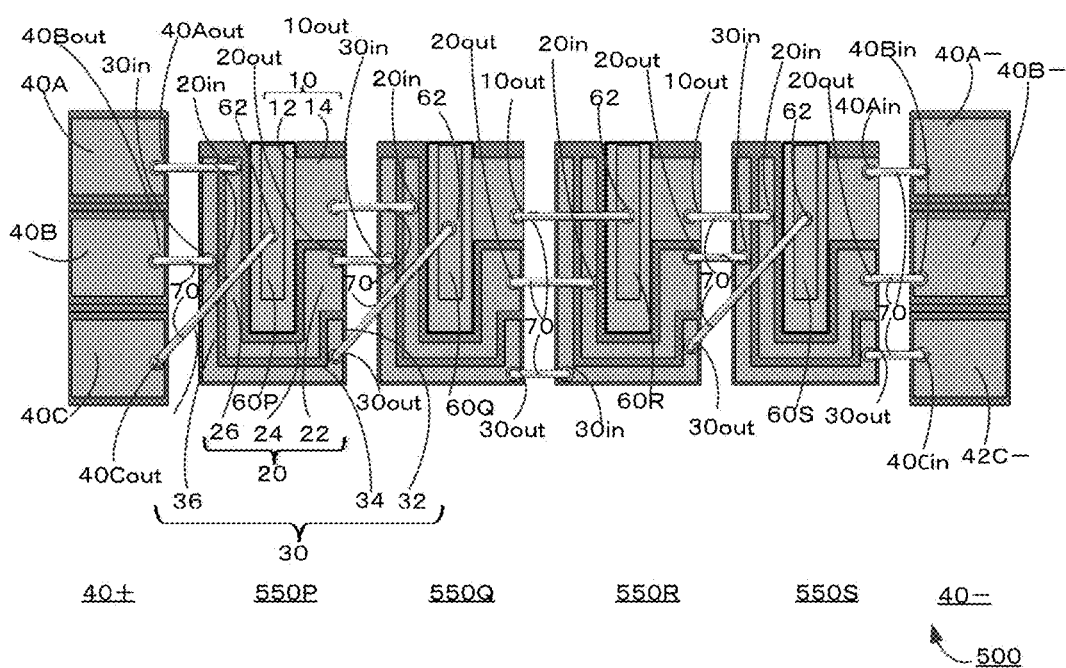
FIG. 9A is a plan view schematically showing the light emitting device according to the third embodiment in an exemplary case in which a single wire is used for each connection.
Figure 9B:
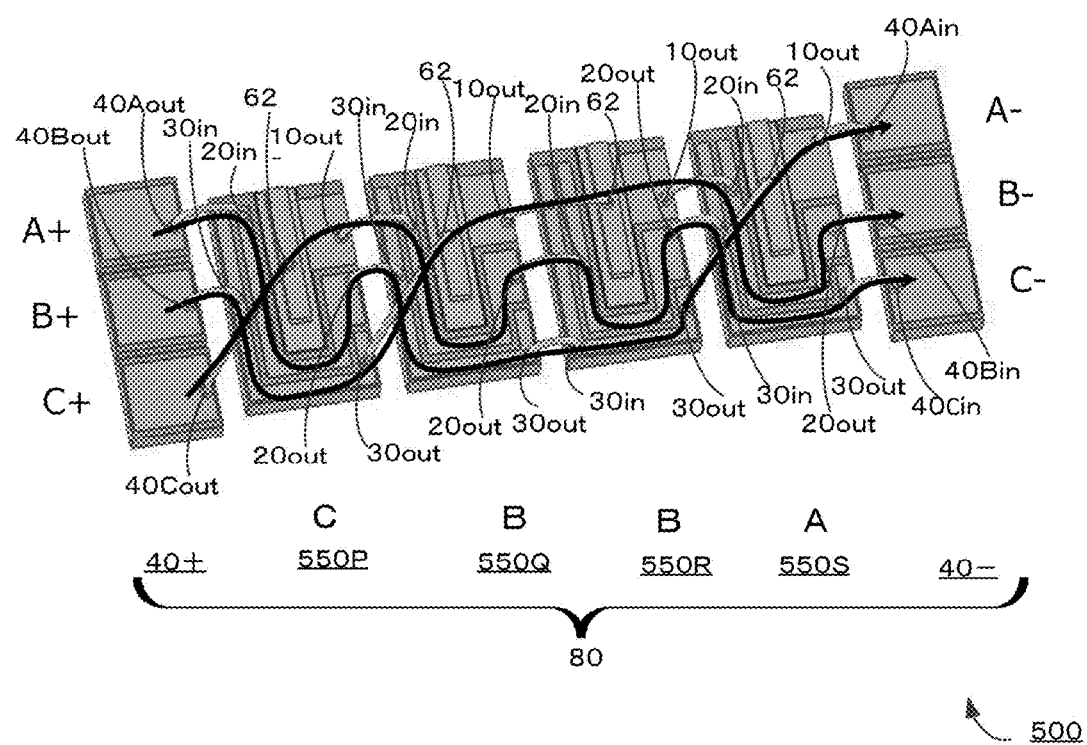
FIG. 9B is a perspective view schematically showing the flow of current in the light emitting device shown in FIG. 9A.

Next, with reference to FIGS. 9A and 9B, a description will be given of the light emitting device 500 including a plurality of wiring patterns 550P to 550S. In the light emitting device 500, a contact region 14 of the wiring pattern 550P and the second conductive pattern 20 of the wiring pattern 550Q are connected to each other via one of wires 70, and the third conductive pattern 30 of the wiring pattern 550P and an upper electrode 62 of a light emitting element mounted on the wiring pattern 550Q are connected to each other via another one of the wires 70. Further, the second conductive pattern 20 of the wiring pattern 550P and the third conductive pattern 30 of the wiring pattern 550Q are connected to each other via even another one of the wires 70. Still Further, the contact region 14 of the wiring pattern 550R and the second conductive pattern 20 of the wiring pattern 550S are connected to each other via still another one of the wires 70, and the third conductive pattern 30 of the wiring pattern 550R and the upper electrode 62 of the light emitting element mounted on the wiring pattern 550S are connected to each other via yet another one of the wires 70. Still further, the second conductive pattern 20 of the wiring pattern 550R and the third conductive pattern 30 of the wiring pattern 550S are connected to each other via further another one of the wires 70. For the sake of brevity, the case where a single wire is used for each connection will be described below, but the description below can be applied to the case where connection is achieved using a plurality of wires. FIG. 9B is a perspective view schematically showing the flow of current in the light emitting device 500 shown in FIG. 9A. The bold lines each having an arrow at its tip (i.e., bold arrows) shown in FIG. 9B indicate the flow of current. Further, in other adjacent wiring patterns, the contact region 14 of the wiring pattern 550Q and the upper electrode 62 of the light emitting element mounted on the wiring pattern 550R are connected to each other via still further another one of the wires 70; the second conductive pattern 20 of the wiring pattern 550Q and the third conductive pattern 30 of the wiring pattern 550R are connected to each other via yet further another one of the wires 70; the third conductive pattern 30 of the wiring pattern 550Q and the third conductive pattern 30 of the wiring pattern 550R are connected to each other the other one of the wires 70.

In the present example, the light emitting device 500 includes the substrate 80 in which four wiring patterns 550P, 550Q, 550R, and 550S are arranged in line between the terminal 40+ and the terminal 40− each disposed on respective one of opposite end sides of the substrate 80. A plurality of light emitting elements 60P, 60Q, 60R, and 60S each having the upper electrode 62 and the lower electrode is mounted on the wiring patterns 550P, 550Q, 550R, and 550S, respectively. The present example includes the current system A in which current flows from the terminal 40A+ on the left side in FIG. 9B toward the terminal 40A− on the right side in FIG. 9B, the current system B in which current flows from the terminal 40B+ on the left side in the drawing toward the terminal 40B− on the right side in the drawing, and a current system C in which current flows from a terminal 40C+ on the left side in the drawing toward a terminal 40C− on the right side in the drawing. Each of the system A, the system B, and the system C may be configured to allow current to flow in a direction opposite to that in FIG. 9B.

The wiring pattern 550 used in the light emitting device 500 according to the third embodiment of the present disclosure includes second and third conductive patterns 20, 30, and thus includes three current systems, so that the light emitting device 500 can be realized in which the light emitting elements 60 configured to emit light of three different colors are separately controlled. For example, the light emitting device 500 can be configured so that, in the plurality of wiring patterns 550P to 550S, light emitting element 60P mounted on the wiring pattern 550P emits blue-color light, both the light emitting elements 60Q and 60R mounted on the wiring pattern 550Q and 550R, respectively, emit green-color light, and the light emitting element 60S mounted on the wiring pattern 550S emits red-color light.

Next, with reference to FIG. 9B, a description will be given of the flow of current in the light emitting device 500. As indicated by bold lines each having an arrow at its tip shown in FIG. 9B, the light emitting element 60P disposed on the wiring pattern 550P is configured to emit light by current in the current system C. Further, the light emitting elements 60Q and 60R respectively disposed on the wiring patterns 550Q and 550R emit light by current in the current system B. Further, the light emitting element 60S provided on the wiring pattern 550S is configured to emit light by the current system A. Thus, light emission of the light emitting element 60P, the light emitting elements 60Q and 60R, and the light emitting element 60S can be separately controlled. Accordingly, the light emitting device 500 configured to emit light of any appropriated desired color such as white can be realized.

Using the wiring patterns used in the light emitting device 500 according to the third embodiment of the present disclosure allows for realizing, for example, a light emitting device in which light emitting elements are arranged such that emission colors are symmetrically arranged with respect to the center to separately control the light emitting elements for each emission color.

In the present embodiment, the wiring pattern 550 is shown in which second and conductive patterns 20, 30 are disposed to surround the light emitting element mounting region 10, but any appropriate wiring pattern may be employed as the wiring pattern 550, and a wiring pattern in which three or more conductive patterns are disposed to surround the light emitting element mounting region can be employed as the wiring pattern 550.

Substrate

As has been described above, the substrate 80 on which the light emitting elements 60 arranged in line can be electrically connected in serial or electrically connected in separate current systems can be obtained by disposing a plurality of wiring patterns 50 used in light emitting devices 100 to 500 according to the first, second or third embodiment of the present disclosure.

That is, the substrate 80 according to the present embodiment includes the plurality of wiring patterns 50, 450, 550. Each of the plurality of wiring patterns 50, 450, 550 includes the first conductive pattern 10 for a light emitting element that includes: the light emitting element mounting region 12 defined by the first side 12A, the second side 12B, the third side 12C, and the fourth side 12D in a plan view; and the contact region 14 connected to a portion of the first side 12A of the light emitting element mounting region 12. Each of the plurality of wiring patterns 50, 450, 550 further includes the second and third conductive patterns 20, 30 that surround a portion of the first side 12A where the contact region does not exist, the entire second side 12B, and a portion of or the entirety of the third side 12C. One end portion of the second and third conductive patterns 20, 30 on the third side 12C side is positioned nearer to the fourth side 12D than another end of the second and third conductive patterns 20, 30 on the first side 12A side is to the fourth side 12D. In adjacent two wiring patterns of each of the wiring patterns 50, 450, 550, the first side 12A of one of the two wiring patterns and the third side 12C of the other of the two wiring patterns are disposed to face each other.

In the substrate 80, with the second and third conductive patterns 20, 30 being disposed to surround the light emitting element mounting region 10, a space attributed to the light emitting element 60 (i.e., space along the dimension of the first side 12A and the third side 12C) can be utilized for the space where the wires 70 are disposed. This arrangement can eliminate the necessity of disposing the wiring patterns at a position spaced apart from the light emitting element, and allows for realizing further compact wiring patterns. Further, with the second and third conductive patterns 20, 30 being disposed to surround the light emitting element mounting region 10, the light emitting elements arranged in line can be electrically connected in series, or arranged in separate current systems.

The substrate 80 according to the present embodiment is not limited to that shown in each of FIGS. 2B, 3B, 5B, 7B, and 9B, and any appropriate number of the wiring patterns can be disposed. Further, it is also possible to employ a substrate constituted of an array of wiring patterns each including a substrate member, or a substrate in which wiring patterns are disposed on a single substrate member. Further, the wiring patterns 50, 450, 550 according to the above-described first to third embodiments may be disposed in combination in a substrate.

Certain embodiments and aspects of the present disclosure have been described above, and details of the disclosure may be modified. In each embodiment, combinations of components, changes in order, and the like can be realized without departing from the scope and spirit of the present disclosure.

DENOTATION OF REFERENCE NUMERALS 10 light emitting element-dedicated conductive pattern
10*in*, 10*out* contact
12 light emitting element mounting region
12A first side
12B second side
12C third side
12D fourth side
14 contact region 20 second conductive pattern
20*in*, 20*out*, 20*by*1, 20*by*2 contact
22 first portion
24 second portion
26 third portion
30 third conductive pattern
30*in*, 30*out* contact
32 first portion
34 second portion
36 third portion
40A to 40C+ terminal
40A to 40C− terminal
40*in*, 40*out* contact
50, 50P to 50S, 450P to 450T, 550P to 550S wiring pattern
60, 60P to 60T light emitting element
62 upper electrode
64 element body
66 lower electrode
80 substrate
82 substrate member
100, 200, 300, 400, 500 light emitting device

What is claimed is:

1. A light emitting device comprising:
a plurality of light emitting elements, each comprising an upper electrode and a lower electrode, the plurality of light emitting elements including:
    a first light emitting element configured to emit light of a first color, and
    a second light emitting element configured to emit light of a second color different from the first color; and
a substrate on which the light emitting elements are disposed, the substrate comprising a plurality of wiring patterns disposed at an upper surface of the substrate, each wiring pattern corresponding to a respective one of the light emitting elements;
wherein each of the wiring patterns comprises:
    a first conductive pattern comprising:
        a light emitting element mounting region to which the lower electrode of a corresponding one of the light emitting elements is connected, the light emitting element mounting region being defined by a first side, a second side, a third side, and a fourth side in a plan view, and
        a contact region connected to a portion of the first side of the light emitting element mounting region; and
    a second conductive pattern surrounding a portion of the first side where the contact region is not present, an entirety of the second side, and a portion of or an entirety of the third side, wherein a first end portion of the second conductive pattern at the third side is positioned nearer to the fourth side than a second end portion of the second conductive pattern at the first side is to the fourth side;
wherein the plurality of wiring patterns includes:
    a first wiring pattern that corresponds to the first light emitting element, and
    a second wiring pattern that corresponds to the second light emitting element,
        wherein the third side of the second wiring pattern faces the first side of the first wiring pattern; and
    wherein the contact region of the first wiring pattern and the second conductive pattern of the second wiring pattern are connected to each other via at least one first wire, and the second conductive pattern of the first wiring pattern and the upper electrode of the second light emitting element are connected to each other via at least one second wire.

2. The light emitting device according to claim 1,
wherein the plurality of light emitting elements further includes a third light emitting element configured to emit light of the first color;
wherein the plurality of wiring patterns further includes:
    a third wiring pattern that corresponds to the third light emitting element,
        wherein the first side of the third wiring pattern faces the third side of the first wiring pattern; and
    wherein the contact region of the third wiring pattern and the upper electrode of the first light emitting element are connected to each other via at least one third wire, and the second conductive pattern of the third wiring pattern and the second conductive pattern of the first wiring pattern are connected to each other via at least one fourth wire.

3. The light emitting device according to claim 1,
wherein the plurality of light emitting elements further includes a fourth light emitting element configured to emit light of the second color;
wherein the plurality of wiring patterns further includes:
    a fourth wiring pattern that corresponds to the fourth light emitting element,
        wherein the third side of the fourth wiring pattern faces the first side of the second wiring pattern; and
    wherein the contact region of the second wiring pattern and the upper electrode of the fourth light emitting element are connected to each other via at least one sixth wire, and the second conductive pattern of the second wiring pattern and the second conductive pattern of the fourth wiring pattern are connected to each other via at least one sixth wire.

4. The light emitting device according to claim 2,
wherein the plurality of light emitting elements further includes a fourth light emitting element configured to emit light of the second color;
wherein the plurality of wiring patterns further includes:
    a fourth wiring pattern that corresponds to the fourth light emitting element,
        wherein the third side of the fourth wiring pattern faces the first side of the second wiring pattern; and
    wherein the contact region of the second wiring pattern and the upper electrode of the fourth light emitting element are connected to each other via at least one sixth wire, and the second conductive pattern of the second wiring pattern and the second conductive pattern of the fourth wiring pattern are connected to each other via at least one sixth wire.

5. The light emitting device according to claim 1,
wherein the at least one first wire comprises a plurality of first wires; and
wherein the at least one second wire comprises a plurality of second wires.

6. The light emitting device according to claim 2,
wherein the at least one first wire comprises a plurality of first wires;
wherein the at least one second wire comprises a plurality of second wires;
wherein the at least one third wire comprises a plurality of third wires; and
wherein the at least one fourth wire comprises a plurality of fourth wires.

7. The light emitting device according to claim 3,
wherein the at least one first wire comprises a plurality of first wires;
wherein the at least one second wire comprises a plurality of second wires;
wherein the at least one third wire comprises a plurality of third wires;
wherein the at least one fourth wire comprises a plurality of fourth wires;
wherein the at least one fifth wire comprises a plurality of fifth wires; and
wherein the at least one sixth wire comprises a plurality of sixth wires.

8. The light emitting device according to claim 4,
wherein the at least one first wire comprises a plurality of first wires;
wherein the at least one second wire comprises a plurality of second wires;
wherein the at least one third wire comprises a plurality of third wires;
wherein the at least one fourth wire comprises a plurality of fourth wires;
wherein the at least one fifth wire comprises a plurality of fifth wires; and
wherein the at least one sixth wire comprises a plurality of sixth wires.

9. The light emitting device according to claim 1, wherein each light emitting element has a lateral light emitting surface located at the fourth side.

10. The light emitting device according to claim 2, wherein each light emitting element has a lateral light emitting surface located at the fourth side.

11. The light emitting device according to claim 3, wherein each light emitting element has a lateral light emitting surface located at the fourth side.

12. The light emitting device according to claim 4, wherein each light emitting element has a lateral light emitting surface located at the fourth side.

13. The light emitting device according to claim 8, wherein each light emitting element has a lateral light emitting surface located at the fourth side.

14. The light emitting device according to claim 1,
wherein at least one of the light emitting elements comprises a gallium-nitride based semiconductor multilayer structure;
wherein the lower electrode of said at least one of the plurality of light emitting elements including the gallium-nitride based semiconductor multilayer structure is a p-side electrode; and
wherein the upper electrode of the at least one of the plurality of light emitting elements including the gallium-nitride based semiconductor multilayer structure is an n-side electrode.

15. The light emitting device according to claim 2,
wherein at least one of the light emitting elements comprises a gallium-nitride based semiconductor multilayer structure;
wherein the lower electrode of said at least one of the plurality of light emitting elements including the gallium-nitride based semiconductor multilayer structure is a p-side electrode; and
wherein the upper electrode of the at least one of the plurality of light emitting elements including the gallium-nitride based semiconductor multilayer structure is an n-side electrode.

16. The light emitting device according to claim 3,
wherein at least one of the light emitting elements comprises a gallium-nitride based semiconductor multilayer structure;
wherein the lower electrode of said at least one of the plurality of light emitting elements including the gallium-nitride based semiconductor multilayer structure is a p-side electrode; and
wherein the upper electrode of the at least one of the plurality of light emitting elements including the gallium-nitride based semiconductor multilayer structure is an n-side electrode.

17. The light emitting device according to claim 4,
wherein at least one of the light emitting elements comprises a gallium-nitride based semiconductor multilayer structure;
wherein the lower electrode of said at least one of the plurality of light emitting elements including the gallium-nitride based semiconductor multilayer structure is a p-side electrode; and
wherein the upper electrode of the at least one of the plurality of light emitting elements including the gallium-nitride based semiconductor multilayer structure is an n-side electrode.

18. The light emitting device according to claim 12,
wherein at least one of the light emitting elements comprises a gallium-nitride based semiconductor multilayer structure;
wherein the lower electrode of said at least one of the plurality of light emitting elements including the gallium-nitride based semiconductor multilayer structure is a p-side electrode; and
wherein the upper electrode of the at least one of the plurality of light emitting elements including the gallium-nitride based semiconductor multilayer structure is an n-side electrode.

19. The light emitting device according to claim 13,
wherein at least one of the light emitting elements comprises a gallium-nitride based semiconductor multilayer structure;
wherein the lower electrode of said at least one of the plurality of light emitting elements including the gallium-nitride based semiconductor multilayer structure is a p-side electrode; and
wherein the upper electrode of the at least one of the plurality of light emitting elements including the gallium-nitride based semiconductor multilayer structure is an n-side electrode.

20. A substrate comprising:
a plurality of wiring patterns, each comprising:
a first conductive pattern comprising:
a light emitting element mounting region defined by a first side, a second side, a third side, and a fourth side in a plan view, and
a contact region connected to a portion of the first side of the light emitting element mounting region; and
a second conductive pattern surrounding a portion of the first side where the contact region is not present, an entirety of the second side, and a portion of or an entirety of the third side, wherein a first end portion of the second conductive pattern at the third side is positioned nearer to the fourth side than a second end portion of the second conductive pattern at the first side is to the fourth side;

wherein the plurality of wiring patterns includes:
a first wiring pattern, and
a second wiring pattern,
wherein the third side of the second wiring pattern faces the first side of the first wiring pattern.

* * * * *